United States Patent
Ko et al.

(10) Patent No.: US 9,306,124 B2
(45) Date of Patent: Apr. 5, 2016

(54) LIGHT EMITTING DEVICE WITH REFLECTIVE ELECTRODE

(75) Inventors: Ting-Chia Ko, Hsinchu (TW); De-Shan Kuo, Hsinchu (TW); Chien-Kai Chung, Hsinchu (TW); Tsun-Kai Ko, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 605 days.

(21) Appl. No.: 13/474,362

(22) Filed: May 17, 2012

(65) Prior Publication Data

US 2013/0307002 A1 Nov. 21, 2013

(51) Int. Cl.
| | | |
|---|---|---|
| H01L 23/48 | (2006.01) | |
| H01L 23/52 | (2006.01) | |
| H01L 29/40 | (2006.01) | |
| H01L 33/40 | (2010.01) | |
| H01L 33/44 | (2010.01) | |

(52) U.S. Cl.
CPC ............. *H01L 33/40* (2013.01); *H01L 33/405* (2013.01); *H01L 33/44* (2013.01); *H01L 2933/0016* (2013.01)

(58) Field of Classification Search
USPC .............. 257/98, 99, 103, 745, 763, E33.064, 257/E29.144; 438/29, 605, 650, 686
See application file for complete search history.

(56) References Cited

U.S. PATENT DOCUMENTS

| | | | |
|---|---|---|---|
| 6,693,352 B1 | 2/2004 | Huang et al. | |
| 6,946,685 B1 | 9/2005 | Steigerwald et al. | |
| 8,039,861 B2 | 10/2011 | Lee | |
| 2002/0014630 A1 | 2/2002 | Okazaki et al. | |
| 2005/0035363 A1 | 2/2005 | Okazaki et al. | |
| 2005/0040423 A1 | 2/2005 | Okazaki et al. | |
| 2005/0051786 A1 | 3/2005 | Okazaki et al. | |
| 2005/0056857 A1 | 3/2005 | Okazaki et al. | |
| 2007/0246735 A1 * | 10/2007 | Yahata et al. | 257/103 |
| 2013/0299858 A1 * | 11/2013 | Kar et al. | 257/98 |

* cited by examiner

*Primary Examiner* — Meiya Li
(74) *Attorney, Agent, or Firm* — Muncy, Geissler, Olds & Lowe, P.C.

(57) ABSTRACT

A light-emitting device includes a semiconductor light emitting stack and an electrode on the semiconductor light emitting stack, wherein the electrode includes a mirror layer, an adhesion layer inserted between the mirror layer and the semiconductor light emitting stack, a bonding layer, and a barrier layer inserted between the mirror layer and the bonding layer and covering the mirror layer to prevent the mirror layer from reacting with the bonding layer, wherein the barrier layer includes a first pair of different metals.

20 Claims, 11 Drawing Sheets

| Phase | Structure | Lattice Parameters (A) | Compasition at % Au | Vicker's Hardness (5 Kg) | Specific Resistance (Ohm-cm) |
|---|---|---|---|---|---|
| Au | FCC | a=4.08 | 84-100 | 60-90 | 2.3 |
| $Au_4Al$ | Cubic | a=6.92 | 80-81.2 | 334 | 37.5 |
| $Au_8Al_3$ $Au_5Al_2$ | Rhombohedral | a=14.68 α=30.5 | 72.7 | 271 | 25.5 |
|  | HCP | a=7.71 c=41.9 |  |  |  |
| $Au_2Al$ | Orthorhombic | A=3.36 B=8.84 C=3.21 | 65-66.8 | 130 | 13.1 |
| AuAl | Monoclinic | A=6.40 B=3.33 C=6.32 β=92.99 | 50 | 249 | 12.4 |
| $AuAl_2$ | FCC | A=5.99 | 32.33 -33.92 | 263 | 7.9 |
| Al | FCC | A=4.05 | 0-0.6 | 20-50 | 3.2 |

|  |  | E4 | | | | | | E4 | | |
|---|---|---|---|---|---|---|---|---|---|---|
| 80°C 360mA Burn-in | TIME(Hrs) | 0.00 | 17.82 | 94.45 | 118.03 | 141.07 | 164.60 | 309.89 | - |
| | AVG I$_v$ (%) | 0 | 8.39 | 7.48 | 6.92 | 7.89 | 10.35 | 12.98 | - |
| | AVG V$_f$ (%) | 0 | 0.33 | 3.53 | 5.70 | 8.56 | 13.85 | 54.92 | - |
| | AVG I$_r$ | 0 | 0 | 0 | 0 | 0.02 | 0.13 | 46.05 | - |
| | | E5 (2pair) | | | | | | | | |
| 120mA Test | TIME(Hrs) | 0.00 | 17.82 | 94.55 | 118.10 | 141.16 | 164.70 | 309.97 | 477.57 |
| | AVG I$_v$ (%) | 0 | 7.66 | 7.26 | 7.16 | 6.78 | 5.75 | 6.09 | 7.51 |
| | AVG V$_f$ (%) | 0 | 0.38 | 1.17 | 1.39 | 1.92 | 2.34 | 3.37 | 5.11 |
| | AVG I$_r$ | 0 | 0 | 0 | 0 | 0 | 0 | 0.01 | 0.04 |
| | | E6 (3pair) | | | | | | | | |
| | TIME(Hrs) | 0.00 | 17.93 | 94.53 | 118.10 | 140.87 | 164.69 | 309.97 | 477.57 |
| | AVG I$_v$ (%) | 0 | 7.32 | 6.45 | 6.45 | 6.18 | 5.74 | 5.20 | 6.34 |
| | AVG V$_f$ (%) | 0 | 0.51 | 1.07 | 1.36 | 1.66 | 1.60 | 2.60 | 4.84 |
| | AVG I$_r$ | 0 | 0.11 | 0.01 | 0 | 0.01 | 0 | 0.11 | 0.32 |

FIG.6

LIGHT EMITTING DEVICE WITH REFLECTIVE ELECTRODE

TECHNICAL FIELD

The present application relates to a light-emitting device with a reflective electrode, and a method to manufacture the same.

DESCRIPTION OF BACKGROUND ART

As the light-emitting efficiency is increased and the cost of manufacturing is decreased, the dream for solid lighting device to replace the traditional lighting device may come true in recent years. Currently, the inner light-emitting efficiency of the light-emitting diode is about 50% to 80%, but a part of the light may be absorbed by the electrode or the light-emitting layer so the total light-emitting efficiency is degraded. Therefore, the mirror layer under the electrode has been provided to solve the problem. When the route of the light extracted from the light-emitting layer is blocked by the electrode, the mirror can reflect but not absorbs the light.

When the electrical current is applied into the light-emitting diode and flows through the electrode, the material of the mirror layer may be migrated to the electrode. The migration of the material of the mirror layer causes the increase of the resistance of electrode and lowers the light-emitting efficiency of the light-emitting diode. So a barrier layer 11 is provided to prevent the migration of the material of the mirror layer 12 as shown in FIG. 1. Nevertheless, in recent years, as the light from a single chip is required to emit more, the electrical current applied to the light-emitting diode is increased, and the large electrical current may destroy the barrier layer 11.

The conventional mirror layer 12 is formed of Al or Ag, and the conventional barrier layer 11 is formed by a single metal which can defense the migration of the mirror layer 12, such as Ti or Mo. But, it is not easy to form a barrier layer 11 which has a uniform thickness on the mirror layer 12. When there is an electrical current passes the mirror layer 12, the metal of the mirror layer 12, such as Al or Ag, would destroy the thinner portion of the barrier layer 11. Therefore, the barrier layer 11 formed by two different metals is preferred. The second metal layer can complement the thinner portion of the first metal layer to enhance the defense of the barrier layer 11. But, if a high electrical current flows through the electrode, the barrier layer 11 formed by two different metals is usually still destroyed by the material of the mirror layer 12. FIG. 2A shows the destroyed electrode 4 with a barrier layer of two different metals under a 120 mA current supplied for 97 hours. FIG. 2B shows the barrier layer 11 has been destroyed. The mirror layer has migrated and been alloyed with the other portion of the electrode 4, and, thus, the conductivity of the electrode 4 substantially decreases.

SUMMARY OF THE DISCLOSURE

A light-emitting device comprises a semiconductor light emitting stack and an electrode on the semiconductor light emitting stack, wherein the electrode comprises a mirror layer, an adhesion layer inserted between the mirror layer and the semiconductor light emitting stack, a bonding layer, and a barrier layer inserted between the mirror layer and the bonding layer and covers the mirror layer to prevent the mirror layer reacting with the bonding layer, wherein the barrier layer comprises a first pair of different metals.

A method of manufacturing a light-emitting device comprises the steps of providing a semiconductor light emitting stack, forming a mirror layer and an adhesion layer on the semiconductor light emitting stack, forming a patterned photoresist layer on the semiconductor light emitting stack, forming a barrier layer covers the mirror layer, forming a bonding layer on the barrier, wherein the barrier layer prevents a reaction between the mirror layer and the bonding layer.

BRIEF DESCRIPTION OF THE DRAWINGS

FIG. 6 shows the reliability comparison of the three kinds of barrier layer 43, one having one pair of metal layers, another having two pairs of metal layers and the other having three pairs of metal layers;

DETAILED DESCRIPTION OF PREFERRED EMBODIMENTS

Figure 1:
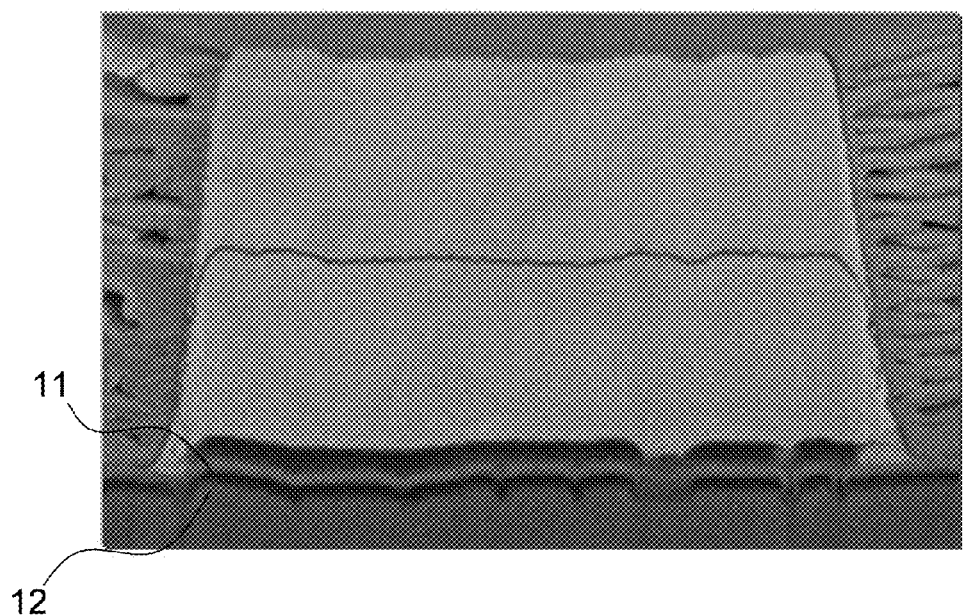
FIG. 1 shows the structure of the electrode with a conventional barrier layer.
Figure 2A:
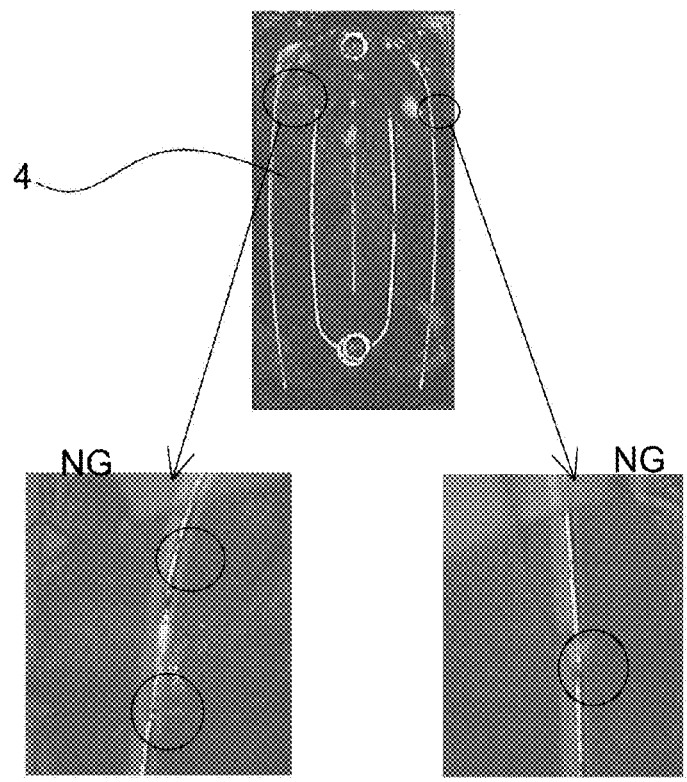
FIGS. 2A to 2B show the electrode with the destroyed conventional barrier layer.
Figure 2B:
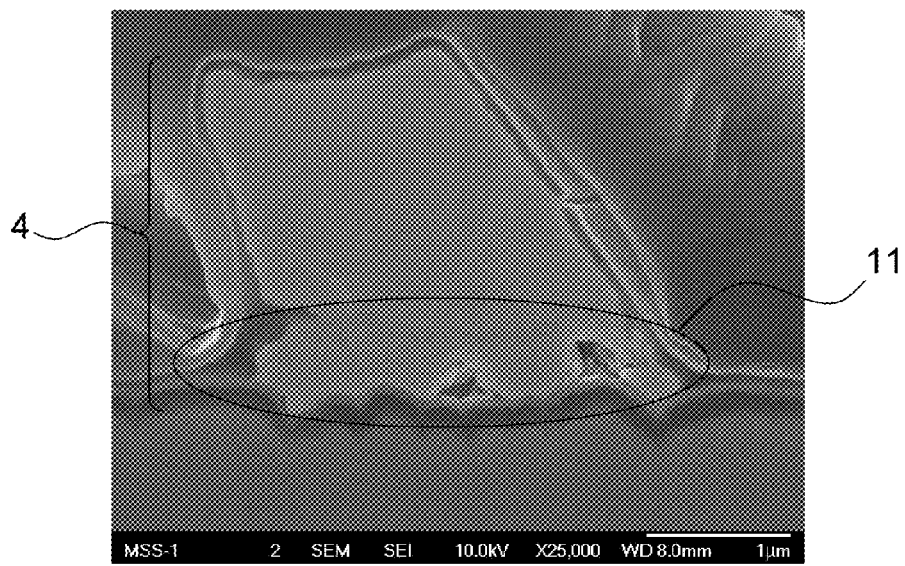

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, thickness, length, etc. Herein, the similar or identical reference numerals will denote the similar or identical components throughout the drawings.

Figure 3A:
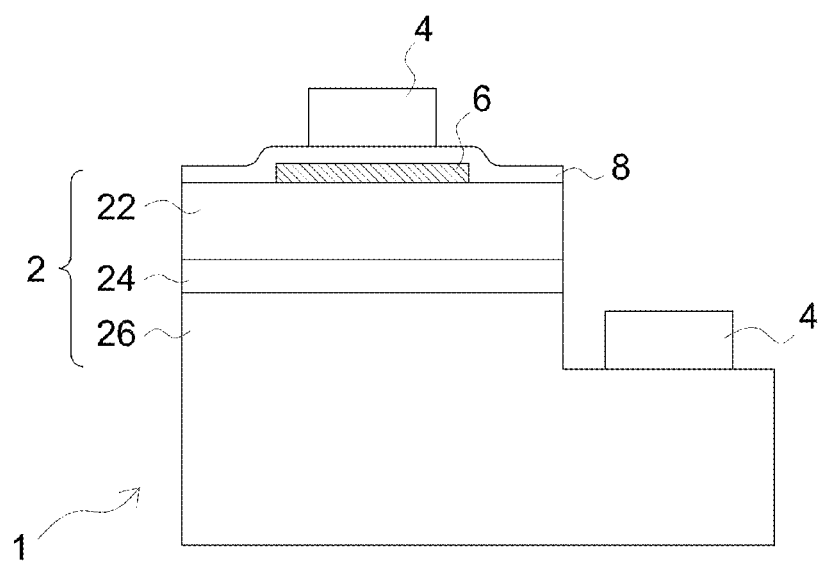
FIGS. 3A to 3F show the electrode with two pairs of different metals according to the first embodiment of the present application.
Figure 3B:
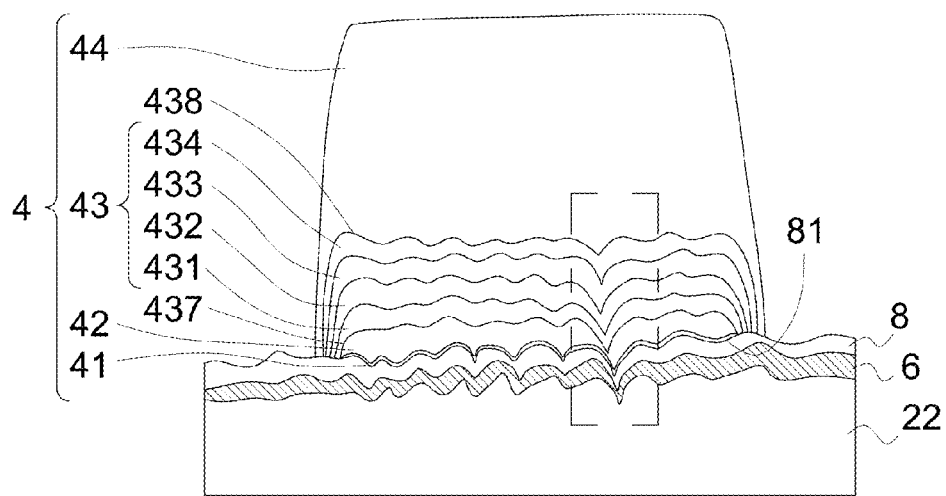

FIG. 3A shows the cross-sectional diagram of a light-emitting diode 1 with electrodes and FIG. 3B shows the detail structure of the electrode on the light-emitting diode according to the first embodiment of the present application. The light-emitting diode 1 has electrodes 4 on the semiconductor light emitting stack 2. The semiconductor light emitting stack 2 has a first semiconductor layer 22, a second semiconductor layer 26 and an active layer 24. If the first semiconductor layer 22 is p-type semiconductor, the second semiconductor layer 26 is n-type semiconductor, or vice versa. The active layer 24 is between the first semiconductor layer 22 and the second semiconductor layer 26. When electrical current flows through the semiconductor light emitting stack 2, the active layer 24 can emit a light. If the material of the active layer 24 is AlGaInP series, it can emit a red light, if the material of the active layer 24 is AlGaInN series, it can emit a green or blue light. There is a transparent conductive layer 8 on the semiconductor light emitting stack 2 and ohmically contacted with the first semiconductor layer 22. The transparent conductive layer 8 can enhance the spread of the electrical current. The material of the transparent conductive layer 8 can be indium tin oxide (ITO), InO, SnO, cadmium-tin oxide (CTO), antimony-doped tin oxide (ATO), ZnO, GaP, or the combination thereof. The transparent conductive layer 8 can be formed by evaporation or sputtering. The electrode 4 disposed on the first semiconductor layer 22 is ohmically contacted with the transparent conductive layer 8. There is a current blocking layer 6 under the transparent conductive layer 8 and in the first semiconductor layer 22 to further spread the electrical current. The material of the current blocking layer 6 has an electric conductivity less than one-tenth of the electric conductivity of the semiconductor material of the first semiconductor layer 22, or be an insulated oxide, such as $SiO_2$, $TiO_2$, or $SiN_x$. The current blocking layer 6 can be formed by ion implantation, oxygen plasma treatment, $N_2O$ plasma treatment, argon plasma treatment, or wet oxidation.

Figures 3C, 3D:
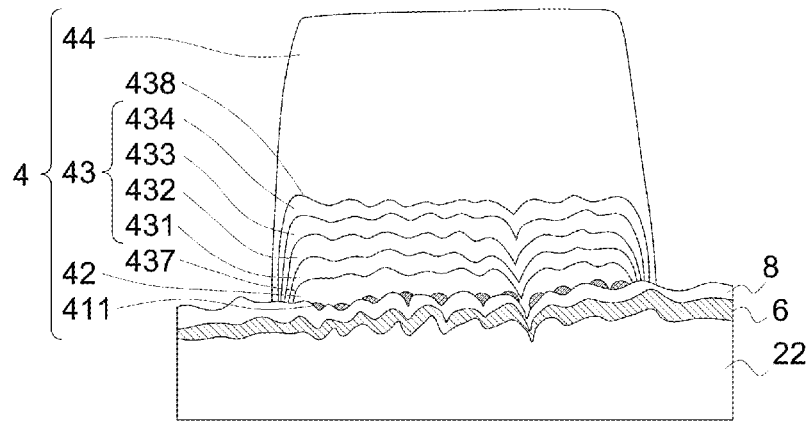

FIG. 3B shows the detailed structure of the electrode 4. The contact surface 81 of the transparent conductive layer 8 and the electrode 4 is rough. The electrode 4 comprises an adhesion layer 41, a mirror layer 42, a barrier layer 43, and a bonding layer 44. The barrier layer 43 comprises a first surface 438 contacting the bonding layer 44 and a second surface 437 contacting the mirror layer 42. The bonding layer 44 is used for wire bonding, and is usually formed of Au. Since the electrode 4 is formed on the first semiconductor layer 22, the light emitted from the active layer 24 may be sheltered or absorbed by the electrode 4 to reduce the light extraction of the light-emitting diode 1. Thus, in order to raise the light extraction, the electrode 4 has the mirror layer 42 between the electrode 4 and the first semiconductor layer 22 to reflect the light to prevent the light from being absorbed or sheltered. The mirror layer is made of the metal with the reflectivity greater than 70%, such as Ag and Al, and the thickness of the mirror layer 42 is greater than or equal to 1000 Å. When the light-emitting diode 1 has the transparent conductive layer 8 on the first semiconductor layer 22, the adhesion between the mirror layer 42 and the transparent conductive layer 8 is not good enough, and the mirror layer 42 peels off the transparent conductive layer 8 easily. Thus, the mirror layer 42 needs an adhesion layer 41 to increase the adhesion between the mirror layer 42 and the transparent conductive layer 8. The adhesion layer 41 is made of the material which has high conductivity and high adhesion between the mirror layer 42 and the transparent conductive layer 8. The adhesion layer 41 is preferably formed of Cr or Rh, and the thickness of the adhesion layer 41 is preferably smaller than or equal to 30 Å such that the adhesion layer 41 is transparent to prevent shading the light. Since Cr and Rh have higher work function, the adhesion layer 41 formed of Cr or Rh can decrease the resistance of the ohmic contact between the electrode 4 and the first semiconductor layer 22 when the first semiconductor layer 22 is p-type semiconductor. In the better embodiment, the thickness of the adhesion layer 41 is smaller than or equal to 5 Å. When the adhesion layer 41 is smaller than or equal to 5 Å, the adhesion layer 41 becomes a plurality of adhesion regions 411 as FIG. 3C shows. The plurality of adhesion regions 411 has the same adhesion as the adhesion layer 41 between the mirror layer 42 and the transparent conductive layer 8. Since the area of the adhesion regions 411 is smaller than the adhesion layer 41, the adhesion regions 411 would not shelter the light reflected by the mirror layer 42, such that light extraction of the light-emitting diode 1 can be increased. The mirror layer 42, the adhesion layer 41, and the adhesion regions 411 can be formed by sputtering or evaporation.

Since the mirror layer 42 is preferably formed of Al or Ag, when electrical current flows through the mirror layer 42, Al or Ag may leave the mirror layer 42 because of oxidation or alloying with the bonding layer 44. Thus, the mirror layer 42 has to be protected to prevent the migration of its material. When the material of the mirror layer 42 is migrated, the content of Al or Ag of the mirror layer 42 is decreased continually. If the content of Al or Ag of the mirror layer 42 is not enough, the resistance of the mirror layer 42 is increased. Referring to FIG. 3D, if Al migrates into the bonding layer 44, Al is alloyed with the bonding layer 44 to form $AuAl_x$ when the bonding layer 44 is formed of Au, and the resistance of the alloy is higher than that of Au or Al. When the mirror layer 42 is formed of Ag and is not covered by the barrier layer 43, Ag is easily oxidized to form silver oxide because of its high activity. The resistance of the product after the oxidation of Ag is much higher than Ag. If the resistance of the mirror layer 42 increases, the electrode 4 fails to conduct the electrical current. Therefore, the mirror layer 42 has to be covered by the barrier layer 43 to prevent the migration of its material or reacting with the bonding layer 44 or with elements in the atmosphere, such as S or O.

The barrier layer 43 comprises a first pair of metal layers and a second pair of metal layers covering the mirror layer 42. The first pair of metal layers comprises the first metal layer 431 and the second metal layer 432, wherein the first metal layer 431 is different from the second metal layer 432. The thickness of the first pair of metal layers is greater than or equal to 400 Å. The second pair of metal layers comprises the third metal layer 433 and the fourth metal layer 434, wherein the third metal layer 433 is also different from the second metal layer 434. The thickness of the second pair of metal layers is also greater than or equal to 400 Å.

Figure 3E:
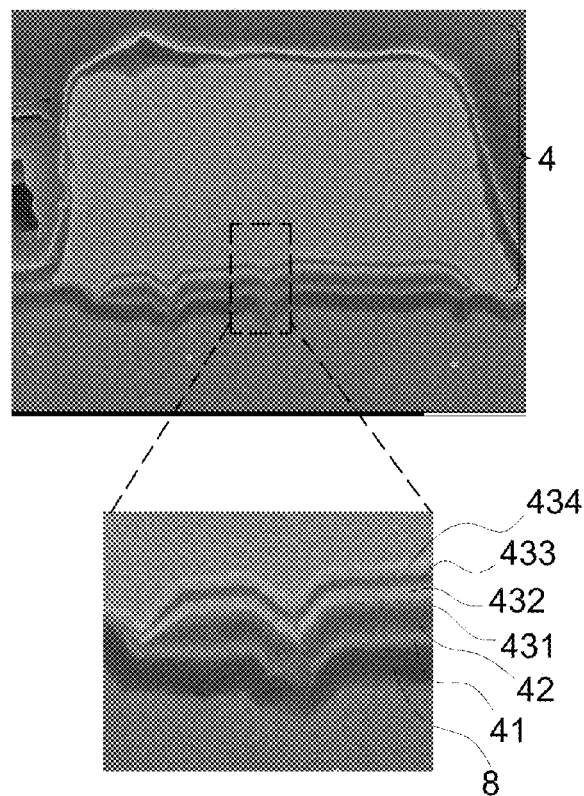
Figure 3F:
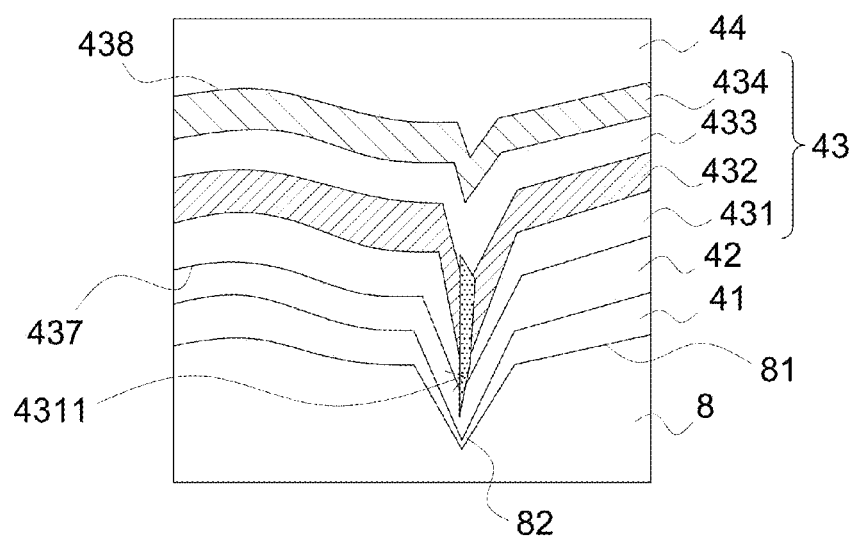

The first metal layer 431 ohmically contacts the mirror layer 42 and covers the mirror layer 42 to prevent the mirror layer 42 from reacting with the bonding layer 44 or air. The first metal layer 431 is chosen from the material which is difficult to react with the material of the mirror layer 42, and has well adhesion with the mirror layer 42. The first metal layer 431 is preferably formed of Ti, Cr, or TiW. The second metal layer 432 ohmically contacts and covers the first metal layer 431. The second metal layer 432 is formed of Pt or Ni. Because the eutectic temperature of the second metal layer 432 and the mirror layer 42 is higher than the eutectic temperature of the first metal layer 431 and the mirror layer 42, the second metal layer 432 provides better protection to the mirror 42 than the first metal layer 431 does. But the material of the second metal layer 432 have poorer adhesion with Al or Ag than the material of the first metal layer 431, so the first metal layer 431 has to be formed between the mirror layer 42 and the second metal layer 432. According to the result of experiment, the first pair of metal layers has better protection than a single metal layer. FIG. 3E shows the picture of the structure of the electrode 4 with two pairs of metal layers, and FIG. 3F shows the diagram of the dotted line region of FIG. 3E. FIG. 3F shows a pit 82 of the contact surface 81 of the transparent conductive layer, and the pit 82 cannot be filled by the adhesion layer 41 and the mirror layer 42. The first metal layer 431 and the second metal layer 432 are formed by physical vapor deposition (PVD) or chemical vapor deposition (CVD). If the pit 82 is too sharp, it is difficult to deposit the material of the first metal layer 431 into the tip area of the pit 82 by the physical vapor deposition (PVD) or chemical vapor deposition (CVD) process, and a first hole 4311 is formed above the pit 82. Because of the first hole 4311, the first metal layer 431 becomes discontinuous, and the material of the mirror layer 42, Al or Ag, would be migrated through the first hole 4311 above the pit 82. During the process of forming the first metal layer 431, due to the nature of the deposition process, as the first metal layer 431 is thicker, the first hole 4311 is wider. When the second metal layer 432 of a material different from the first metal layer 431 is formed, it can make the first hole 4311 smaller or even fill the first hole 4311 up.

Nevertheless, the first metal layer 431 and the second metal layer 432 cannot protect the mirror layer 42 well even the first hole 4311 is filled, because the portion of the second metal layer 432 above the pit 82 is still thin. When electrical current flows through the mirror layer 42, the material in the thin portion of the second metal layer 432 above the first hole 4311 reacts with the material of the mirror layer 42 faster than other portion of the second metal layer 432 dose. Therefore, a second pair of metal layers comprising the third metal layer 433 and the fourth metal layer 434 is provided for stronger protection for the mirror layer 42 above the pit 82. In a preferred embodiment, the third metal layer 433 is formed of Ti, Cr, or TiW. The material of the third metal layer 433 is different from the material of second metal layer 432. The fourth metal layer 434 is formed of Pt or Ni. The third metal layer 433 and the fourth metal layer 434 are formed by physical vapor deposition (PVD) or chemical vapor deposition (CVD). When the barrier layer 43 comprises the first pair of metal layers, 431 and 432, and the second pair of metal layers, 433 and 434, the barrier layer 43 can fill the pit 82 and prevent the first hole 4311 from extending to the bonding layer 44, and for the barrier layer 43, the first surface 438 is more even than the second surface 437.

Figure 4A:
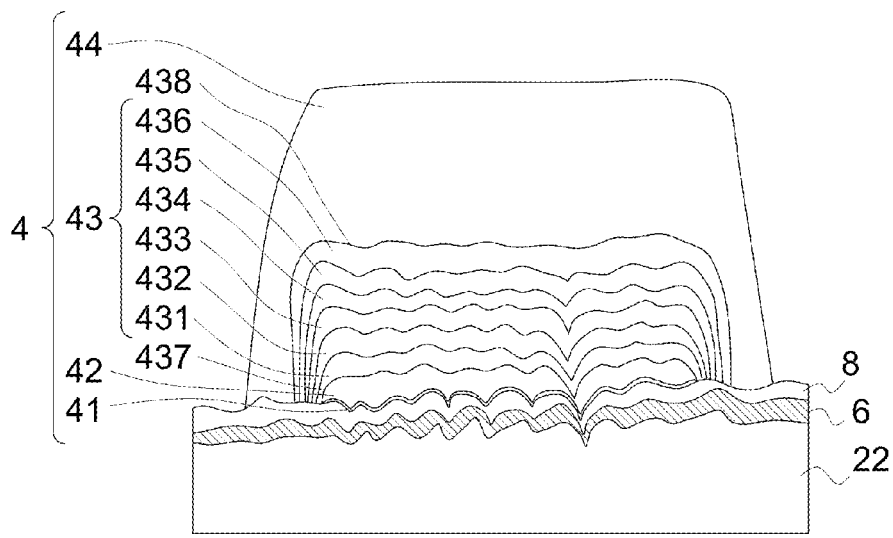
FIGS. 4A to 4D show the electrode with three pairs of different metals according to the second embodiment of the present application.
Figure 4B:
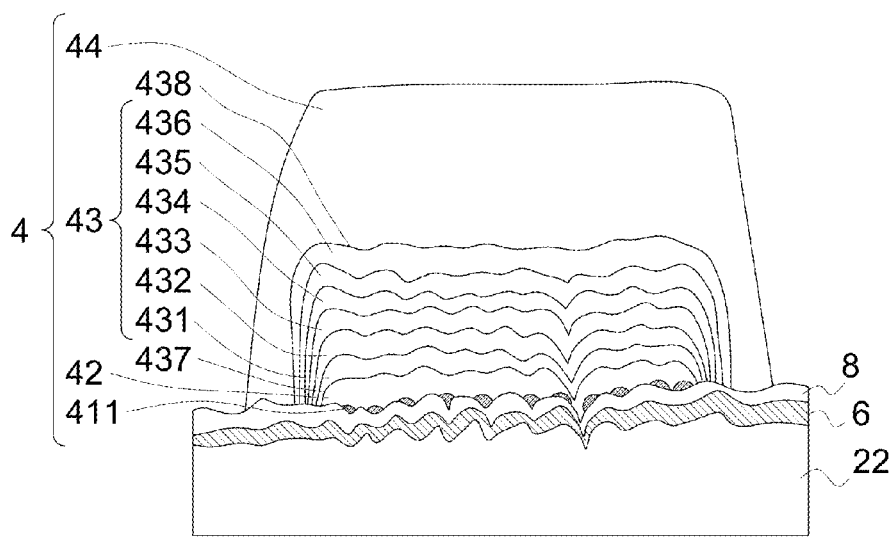
Figure 4C:
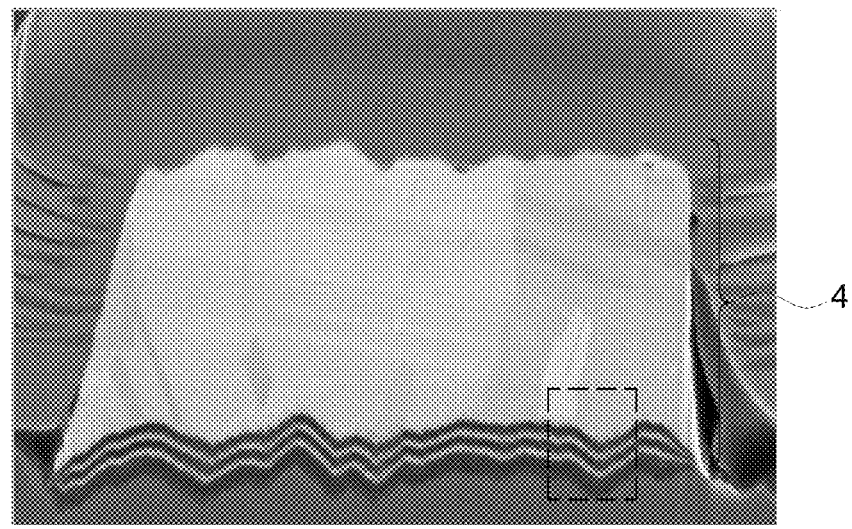
Figure 4D:
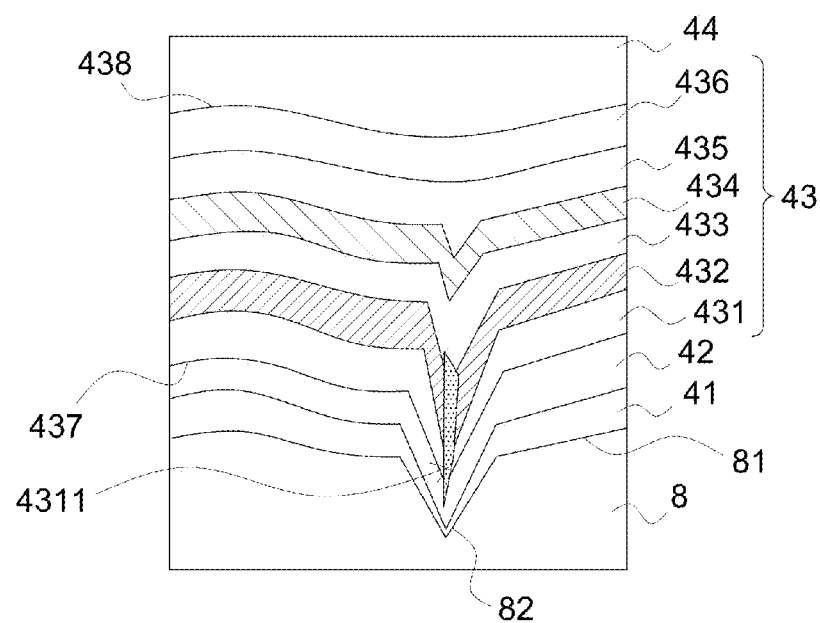

FIG. 4A shows the detail structure of the electrode 4 on the light-emitting diode 1 according to the second embodiment of the present application. The difference between the second embodiment and the first embodiment is that the barrier layer 43 further comprises a third pair of metal layers, 435 and 436. The third pair of metal layers comprises the fifth metal layer 435 and the sixth metal layer 436. The thickness of the third pair of metal layers is also greater than or equal to 400 Å. The fifth metal layer 435 is preferably formed of Ti, Cr, or TiW. The material of the fifth metal layer 435 is different from the fourth metal layer 434. The sixth metal layer 436 is preferably formed of Pt or Ni. The fifth metal layer 435 and the sixth metal layer 436 are formed by physical vapor deposition (PVD) or chemical vapor deposition (CVD). When the thickness of the adhesion layer 41 is smaller than or equal to 5 Å, the adhesion layer 41 would become a plurality of adhesion regions 411 as FIG. 4B shows. FIG. 4C shows the picture of the structure of the electrode 4 with three pairs of metal layers, and FIG. 4D shows the enlarged view of the dotted line region of FIG. 4C. The fifth metal layer 435 and the sixth metal layer 436 can fill the pit 82 and enhance the capability to prevent the mirror layer 42 from material migration or being oxidized so the reliability of the electrode 4 can be increased.

Figure 5A:
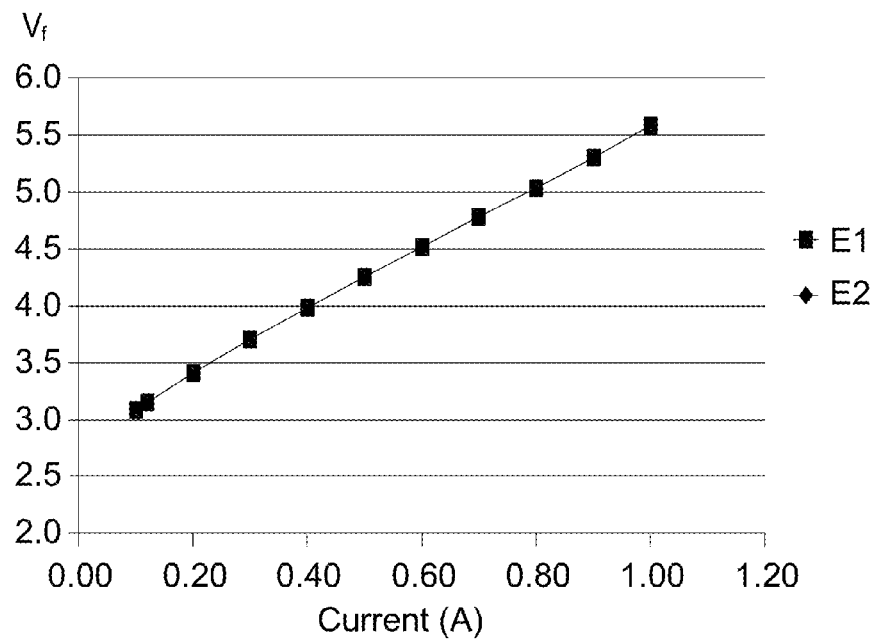
FIG. 5A shows a chart of the $V_f$ vs. Current for the conventional light-emitting diode and the light-emitting diode according to the second embodiment of the present application.
Figure 5B:
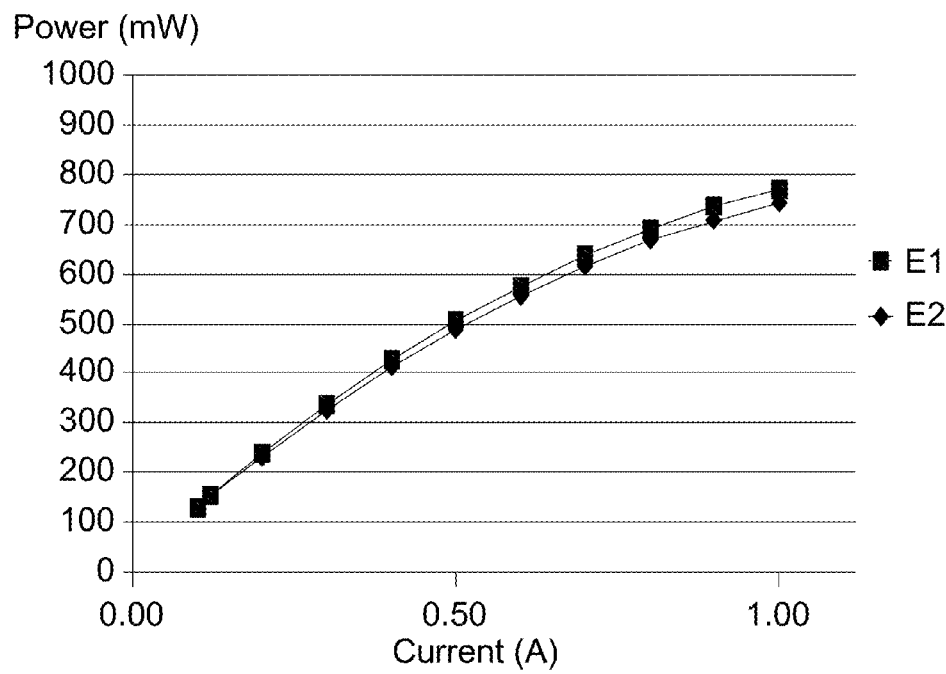
FIG. 5B shows a chart of the Power vs. Current for the conventional light-emitting diode and the light-emitting diode according to the second embodiment of the present application.

FIG. 5A shows a chart of the $V_f$ vs. Current for the conventional light-emitting diode with one pair of metal layers E2 and the light-emitting diode with three pairs of metal layers E1. FIG. 5B shows a chart of Power vs. Current for the conventional light-emitting diode compared with one pair of metal layers E2 and the light-emitting diode with three pairs of metal layers E1. It indicated that the barrier layer 43 comprising three pairs of metal layers does not influence the forward voltage $V_f$ and power performance of the light-emitting diode.

FIG. 6 shows the reliability comparison of the three kinds of barrier layer 43; the first light-emitting diode E4 has one pair of metal layers for barrier layer, the second light-emitting diode E5 has two pairs of metal layers for barrier layer, and the third light-emitting diode E6 which barrier layer has three pairs of metal layers for barrier layer. The test conditions are that the test temperature is 80° C. and the test current is 120 mA. The result indicated that the first light-emitting diode E4 fails after 309.89 hours while the light-emitting diodes E5 and the light-emitting diode E6 operate normally after 477.57 hours.

Figure 7A:
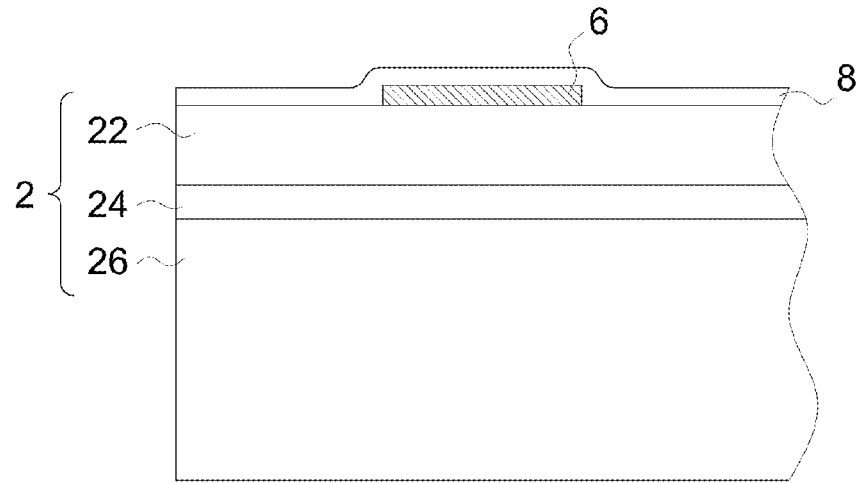
FIGS. 7A to 7D show the process of manufacturing the electrode 4 according to one embodiment of the present application.

FIGS. 7A to 7D show the process of manufacturing the electrode 4 according to one embodiment of the present application. FIG. 7A shows the step of providing the semiconductor light emitting stack 2 with the transparent conductive layer 8 covering the first semiconductor layer 22. The current blocking layer 6 is formed in the first semiconductor layer 22 and is under the transparent conductive layer 8. The semiconductor light emitting stack 2 has a first semiconductor layer 22, a second semiconductor layer 26 and an active layer 24. If the first semiconductor layer 22 is p-type semiconductor, the second semiconductor layer 26 can be n-type semiconductor, or vice versa. The active layer 24 is between the first semiconductor layer 22 and the second semiconductor layer 26. When electrical current flows through the semiconductor light emitting stack 2, the active layer 24 can emit a light. If the material of the active layer 24 is AlGaInP series material, it can emit a red light, and if the material of the active layer 24 is AlGaInN series material, it can emit a green or blue light. There is a transparent conductive layer 8 on the semiconductor light emitting stack 2 and ohmically conducted with the first semiconductor layer 22. The transparent conductive layer 8 can enhance the spread of the electrical current. The material of the transparent conductive layer 8 can be ITO, InO, SnO, CTO, ATO, ZnO, GaP, or the combination thereof. The transparent conductive layer 8 can be formed by evaporation or sputtering. The material of the current blocking layer 6 have an electric conductivity less than one-tenth of the electric conductivity of the semiconductor material of the first semiconductor layer 22, or be an insulation material, such as $SiO_2$, $TiO_2$, or $SiN_x$. The current blocking layer 6 can be formed by ion implantation, oxygen plasma treatment, $N_2O$ plasma treatment, argon plasma treatment, or wet oxidation.

Figure 7B:
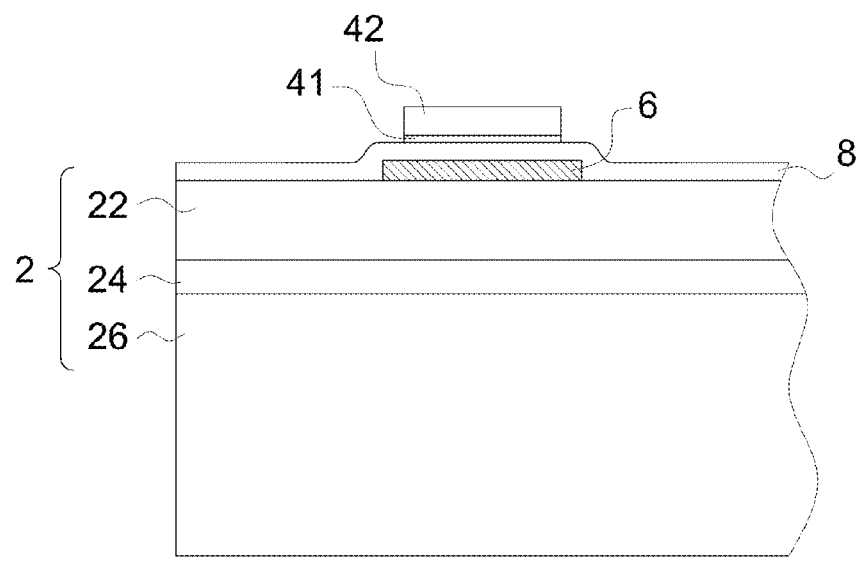

FIG. 7B shows the mirror layer 42 on the transparent conductive layer 8. The mirror layer 42 is made of the metal with the reflectivity greater than 70%, such as Ag and Al, and the thickness of the mirror layer 42 is greater than or equal to 1000 Å. Because the adhesion between the mirror layer 42 and the transparent conductive layer 8 is not strong enough, the electrode 4 peels off the transparent conductive layer 8 easily. Thus, the adhesion layer 41 is formed to ohmically contact the mirror layer 42 and the transparent conductive layer 8 to increase the adhesion between the electrode 4 and the transparent conductive layer 8. The adhesion layer 41 is made of Cr in the embodiment.

Figure 7C:
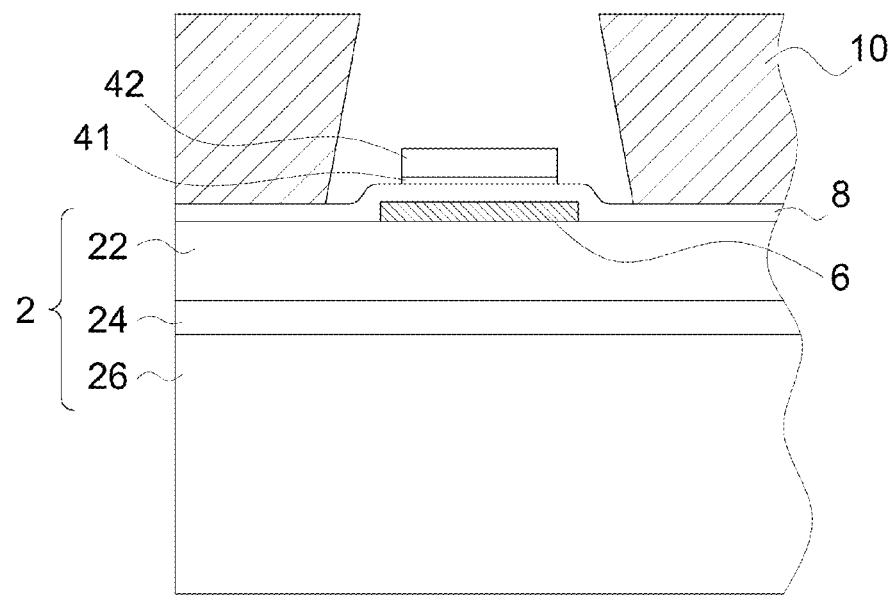

FIG. 7C shows a patterned coverage layer 10 on the transparent conductive layer 8 which does not cover the mirror layer 42. The material of the patterned coverage layer 10 can be positive photoresist or negative photoresist. The positive photoresist or the negative photoresist covers the conductive layer 8 and the mirror layer 42. Then, the positive photoresist or the negative photoresist is exposed to the light with specific wavelength, electron-beam, X-ray, or ion-beam to remove the portion of the positive photoresist or the negative photoresist on the mirror layer 42. After the above mentioned process, the patterned coverage can be formed.

Figure 7D:
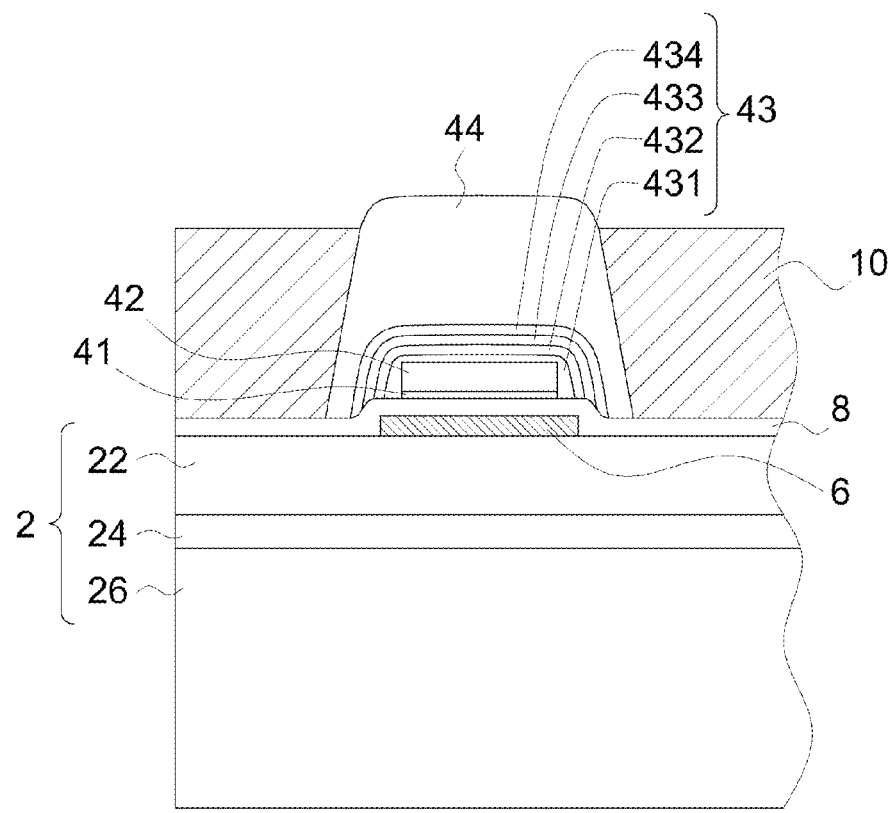

FIG. 7D shows the barrier layer 43 and the bonding layer 44. The first metal layer 431, the second metal layer 432, the third metal layer 433, the fourth metal layer 434 and the bonding layer 44 are formed sequentially. Especially, the mirror layer 42 is totally covered by the first metal layer 431, the first metal layer 431 is totally covered by the second metal layer 432, the second metal layer 432 is totally covered by the third metal layer 433, the third metal layer 433 is totally covered by the fourth metal layer 434, and the fourth metal layer 434 is totally covered by the bonding layer 44.

The light-emitting device or light-emitted diode mentioned above may be mounted with the substrate onto a submount via a solder bump or a glue material to form a light-emitting apparatus. Besides, the submount further comprises one circuit layout electrically connected to the electrode of the light-emitting device via an electrical conductive structure, such as a metal wire.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A light-emitting device, comprising:
   a semiconductor light emitting stack;
   an electrode on the semiconductor light emitting stack, the electrode comprising a mirror layer, an adhesion layer inserted between the mirror layer and the semiconductor light emitting stack, a bonding layer, and a barrier layer inserted between the mirror layer and the bonding layer and covering the mirror layer to prevent the mirror layer from reacting with the bonding layer; and
   a plurality of pits between the electrode and the semiconductor light emitting stack,
   wherein the barrier layer comprises a first pair of metal layers and a second pair of metal layers, and the adhesion layer is electrically conductive and has a thickness smaller than or equal to 30 Å, and one of the plurality of pits is not filled up by the adhesion layer and the mirror layer.

2. The light-emitting device according to claim 1, wherein the semiconductor light emitting stack comprises a first semiconductor layer, a second semiconductor layer and an active layer between the first semiconductor layer and the second semiconductor layer, and the electrode ohmically contacts the first semiconductor layer or the second semiconductor layer.

3. The light-emitting device according to claim 1, wherein the first pair of metal layers comprises a first metal layer and a second metal layer, and the adhesion between the first metal layer and the mirror layer is higher than the adhesion between the second metal layer and the mirror layer.

4. The light-emitting device according to claim 3, wherein the first metal layer is easier to react with the mirror layer than the second metal layer is.

5. The light-emitting device according to claim 1, wherein the second pair of metal layers comprises a third metal layer and a fourth metal layer, and the adhesion between the third metal layer and the mirror layer is lower than the adhesion between the fourth metal layer and the mirror layer.

6. The light-emitting device according to claim 5, wherein the third metal layer is easier to react with the mirror layer than the fourth metal layer.

7. The light-emitting device according to claim 1, wherein the first pair of metal layers or the second pair of metal layers comprises any two of Cr, Pt, Ti, TiW, and Ni.

8. The light-emitting device according to claim 1, wherein a total thickness of the first pair of metal layers or the second pair of metal layers is greater than or equal to 400 Å.

9. The light-emitting device according to claim 1, wherein the barrier layer fully covers the mirror layer to prevent the mirror layer from contacting the bonding layer.

10. The light-emitting device according to claim 1, wherein the barrier layer comprises a first surface contacting the bonding layer and a second surface contacting the mirror layer, and the first surface is more even than the second surface.

11. The light-emitting device according to claim 1, wherein a thickness of the mirror layer is greater than or equal to 1000 Å.

12. The light-emitting device according to claim 1, wherein a reflectivity of the mirror layer is greater than or equal to 70% for a light emitted from the semiconductor light emitting stack.

13. The light-emitting device according to claim 1, wherein a material of the mirror layer comprises Al or Ag.

14. The light-emitting device according to claim 1, wherein the adhesion layer comprises Cr or Rh.

15. The light-emitting device according to claim 1, wherein the thickness of the adhesion layer is smaller than or equal to 5 Å.

16. The light-emitting device according to claim 1, wherein the adhesion layer is discontinuous and comprises a plurality of adhesion regions.

17. The light-emitting device according to claim 1, wherein the bonding layer fully covers the barrier layer.

18. The light-emitting device according to claim 1, wherein the second pair of metal layers fully covers the first pair of metal layers.

19. The light-emitting device according to claim 1, wherein the plurality of pits is filled up by the barrier layer.

20. The light-emitting device according to claim 1, further comprising a transparent conductive layer, wherein a top surface of the transparent conductive layer comprises the plurality of pits.

* * * * *